United States Patent [19]

DeBenedictis

[11] 4,404,676
[45] Sep. 13, 1983

[54] PARTITIONING METHOD AND APPARATUS USING DATA-DEPENDENT BOUNDARY-MARKING CODE WORDS

[75] Inventor: Erik P. DeBenedictis, Pasadena, Calif.

[73] Assignee: Pioneer Electric Corporation, Tokyo, Japan

[21] Appl. No.: 248,907

[22] Filed: Mar. 30, 1981

[51] Int. Cl.³ .................. H04L 17/00; G06F 11/10
[52] U.S. Cl. ............................ 371/47; 375/110; 371/42
[58] Field of Search ............ 371/47, 42, 46; 375/106, 110

[56] References Cited

U.S. PATENT DOCUMENTS

| | | | |
|---|---|---|---|
| 3,336,467 | 8/1967 | Frey, Jr. .................... | 371/42 |
| 3,825,893 | 7/1974 | Bossen et al. ............. | 371/38 |
| 3,860,907 | 1/1975 | Marshall .................... | 371/47 |
| 3,873,920 | 3/1975 | Apple, Jr. et al. ........ | 371/47 |
| 3,961,311 | 6/1976 | Pavoni et al. ............. | 371/42 |
| 4,211,997 | 7/1980 | Rudnick et al. .......... | 371/38 |
| 4,308,557 | 12/1981 | Dieterich .................. | 371/40 |
| 4,316,284 | 2/1982 | Howson .................... | 371/47 |
| 4,316,285 | 2/1982 | Boblilin et al. ........... | 371/47 |

OTHER PUBLICATIONS

NASA Tech Brief, Simultaneous Message Framing and Error Detection, Sep. 1968, Brief 68-10330.

*Primary Examiner*—Charles E. Atkinson
*Attorney, Agent, or Firm*—Christie, Parker & Hale

[57] ABSTRACT

A data-dependent code word consisting of redundancy bits marks a boundary of a multi-bit cell, and is coded to bear a mapping relationship to a data block within the cell. Embodiments using the data-dependent code word provide various types of synchronization, and provide for simplifying an error-correction task.

12 Claims, 10 Drawing Figures

PARTITIONING METHOD AND APPARATUS USING DATA-DEPENDENT BOUNDARY-MARKING CODE WORDS

BACKGROUND OF THE INVENTION

In general, this invention relates to digital data processing; more particularly, it relates to a method and apparatus using a data-dependent boundary-marking code word to partition data into cells.

A single binary digit (bit) has only two possible values and, accordingly, by itself can represent very little information. A plurality of bits can be grouped in a predetermined order to represent much more information. As one representative example, four bits can be grouped in a most-significant-bit to least-significant-bit order to provide for representing any one of the sixteen hexidecimal digits "O" to "F".

Such a four-bit grouping is one type of "byte-size" grouping. Bytes of 4 bits or 8 bits are very commonly used as elements, in a hierarchical grouping of bits, to provide for representing an even larger amount of information.

In processing information, it is necessary to ensure consistency in the ordering of bits composing a group that is to be processed at different times or by different communicating subsystems. One common approach directed to ensuring such consistency employs a unique marker that identifies a boundary of a multi-bit cell. Such a marker has been defined by a pulse signal differing in amplitude or duration from the type of signal used to represent a data bit. Such a marker has also been defined by a sequence of bits composing a code word that is fixed in that every cell contains the same code word as its boundary marker.

SUMMARY OF THE INVENTION

In contrast to the types of boundary markers referred to above, this invention uses a data-dependent code word consisting of redundancy bits to mark a boundary of a multi-bit cell. The data-dependent code word is coded to bear a mapping relationship to a data block within the cell.

A process according to the invention provides for detecting such data-dependent code words contained in a set of data bits and redundancy bits. The set includes a plurality of multi-bit cells. Each such cell includes m data bits constituting a block and n redundancy bits constituting a data-dependent boundary-marking code word for the cell. The code word bears a predetermined mapping relationship to the block of the cell and otherwise is indistinguishable from any arbitrarily selected group of n data bits. One of the steps of the process is to congregate a multiplicity of partially overlapping groups of the bits as candidate cells. Each candidate cell includes an m-bit portion and an n-bit portion. The overlapping of the groups is such that the n-bit portion of each candidate cell is separately included among the m-bit portion of a plurality of other candidate cells. The process further comprises the step of testing each of the multiplicity of candidate cells to determine, as each candidate cell undergoes testing, whether its n-bit portion bears the predetermined mapping relationship to its m-bit portion as is characteristic of a valid cell. The process further includes the step of generating a candidate-valid signal for each candidate cell that upon testing is determined to be a valid cell.

In one specific version of the process, the testing step includes the step of generating a syndrome word comprising n bits to provide an indication of whether, for the candidate cell undergoing testing, said predetermined mapping relationship exists, and in this specific version the step of generating the candidate-valid signal includes the step of decoding the syndrome word.

In an alternative specific version of the process, the testing step includes the steps of translating the m-bit portion of the candidate cell undergoing testing to generate a check code word and comparing the n-bit portion of the candidate cell undergoing testing with the generated check code word.

The process is useful in providing various types of synchronization including block and bit synchronization. When practiced to provide bit synchronization, the process includes the step of forming a plurality of individually identifiable clock signals. Each such clock signal has reoccurring clock pulses with the clock pulses of each such clock signal differing from those of each other clock signal as to the time of occurrence. The clock pulses are used to sample a data signal to derive a plurality of sample bits that are congregated and tested in accordance with the broad features described above.

In terms of apparatus, the present invention is embodied in a decoder for a data signal defining information, including data bits and redundancy bits, at spaced points in time. The decoder includes first-in, first-out (FIFO) register means through which the data signal propagates. At each of a succession of spaced points in time the FIFO register means has stored in it a respective one of a succession of candidate cells. Each candidate cell, when stored in the FIFO register means, includes a block-length portion and a code-word-length portion. The decoder further comprises testing means synchronized with the FIFO register means for successively testing each of the candidate cells to determine, as each candidate cell undergoes testing, whether its code-word-length portion bears the predetermined mapping relationship to its block-length portion as is characteristic of a valid cell. The decoder further includes means for generating a candidate-valid signal for each candidate cell that upon testing is determined to be a valid cell.

In various embodiments of the invention disclosed herein, decoders provide block and bit synchronization for either a serial-by-bit data signal or a serial-by-byte data signal.

In the presently preferred embodiment of the present invention there is provided a record/playback system for storing on a storage medium and subsequently deriving the stored information from the storage medium. The system comprises encoding means and decoding means, each of which utilizes a data-dependent boundary-marking code word bearing a predetermined mapping relationship to a data block of a cell and otherwise being indistinguishable from arbitrarily selected groups of data bits.

One of the advantageous features of the present invention resides in a feature whereby cell-duration timing means are synchronized with the FIFO register means to generate an error-flag signal. This signal is generated after a predetermined interval of time elapses during which no candidate-valid signal is generated. It will be appreciated by those skilled in the art that an external sybsystem organized to provide error correction of blocks received from the decoder can be more simply implemented when there is such an error-flag signal. These and other advantageous features of the present invention will be better understood after considering the following detailed description.

BRIEF DESCRIPTION OF THE DRAWINGS

FIG. 2 comprises FIGS. 2A, B and C, which are timing diagrams relating a data signal derived from a record member to a plurality of individually identifiable clock signals used in certain embodiments of the invention;

FIG. 5 is a block diagram of an arrangement in which a serial-by-bit signal is processed by a combination encoder/decoder embodying the invention;

DETAILED DESCRIPTION

As an introduction to the detailed description of the preferred practices and embodiments of this invention, there will first be discussed, with reference to FIG. 1, certain matters relating to the problem of block synchronization. Solving this problem involves achieving a consistent starting point in encoding and decoding information.

Figure 1:
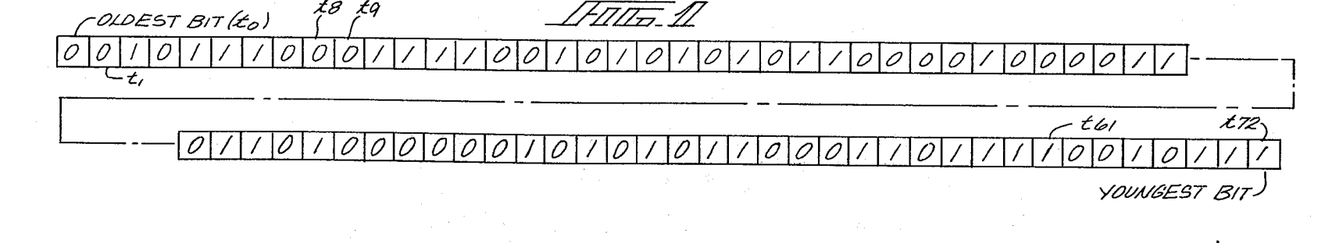
FIG. 1 is a chart depicting the binary values of a serial-by-bit data signal containing a data-dependent boundary-marking code word used by this invention.

FIG. 1 is a chart of a sequence of binary values defined by a serial-by-bit data signal during an arbitrarily selected interval. The data signal has been encoded to define an ordered set of bits according to a hierarchical grouping involving blocks. This data signal is representative of the kind of signal that can be derived from a record member such as a track on a disk or tape, or from a digital communication channel.

In this representative example, a block consists of fifty-six consecutive bits that are divided into fourteen bytes of four bits per byte. During the arbitrarily selected interval convered by the chart of FIG. 1, one complete block and one partial block are included among the depicted bits. The oldest bit of the depicted bits is labeled t0, and it has a 0 binary value. The youngest bit is labeled t72, and it has a 1 binary value. As encoded, the complete block starts with the bit labeled t9, and the fourteen bytes of the complete block are, in hexidecimal digits: 7, 9, 5, 5, 8, 4, 3, 6, 8, 1, 5, 6, 3, and 7.

If, in decoding, a block mis-synchronization occurred such that the oldest bit t0 were selected as the starting point for decoding a block-length group, then the fourteen bytes of the block-length group would be, in hexidecimal digits: 2, E, 3, C, A, A, C, 2, 1, 3, 4, 0, A, and B.

It will be appreciated that essentially the same block synchronization problem is presented with respect to a serial-by-byte data signal that has been encoded according to a hierarchical grouping involving multi-byte blocks. Embodiments of the invention provide block synchronization for either serial-by-bit or serial-by-byte data signals.

Embodiments of the invention also solve a related problem relating to bit synchronization. The problem of bit synchronization will now be discussed with reference to the timing diagrams of FIG. 2.

Figures 2A, 2B:
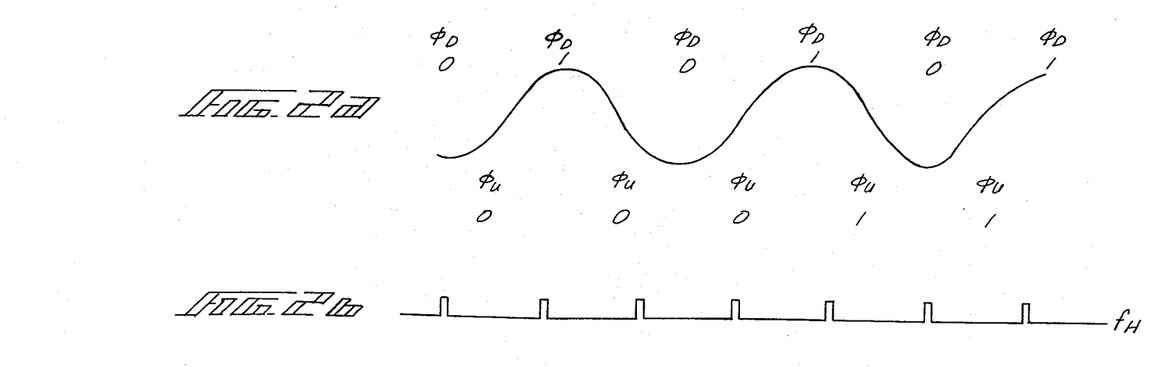

The oscillatory signal depicted in FIG. 2A is representative of the kind of signal that, at each of a succession of predetermined points in time, defines a binary value of a serial-by-bit succession of bits. Such an oscillatory signal can be derived from a track of a magnetic tape, for example. In order to recover data from the oscillatory signal, it is necessary to sample it. Sampling at the desired frequency and phase, as indicated by the repeating samples $\phi D$ shown in FIG. 2, results in the following sequence of binary values: 0, 1, 0, 1, 0, and 1. If the sampling occurs at the desired frequency, but at an undesired phase such as is indicated by the repeating samples $\phi U$ shown in FIG. 2, this would result in the following erroneous sequence: 0, 0, 0, 1, and 1.

Figure 2C:
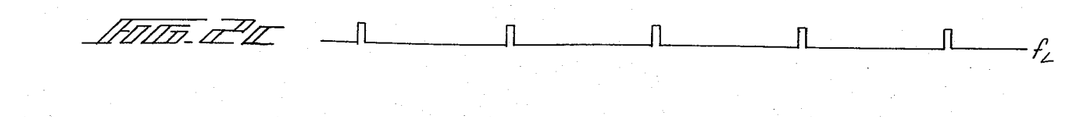

FIGS. 2B and 2C respectively show undesirably high frequency and undesirably low frequency clock signals for sampling the oscillatory signal of FIG. 2A. Plainly, the sequence of binary values that would result from such sampling would be quite different from the intended sequence.

In addition to the foregoing introductory points concerning the nature of the block and bit synchronization problems, there are several points concerning terminology that will be helpful in understanding the following detailed descriptions of embodiments of the invention.

The term "signature" is used hereinafter in connection with the coding of a data-dependent boundary-marking code word (BMCW). A signature can be viewed as an n-bit number calculated from an m-bit number, m being larger than n, in such a way that no pair of different n-bit numbers are calculated from the same m-bit number. The term "syndrome" is used hereinafter in connection with a word generated in a decoding operation. The coding of the syndrome word depends upon the relationship between the signature of a candidate block and the coding of a candidate boundary-marking code word.

A known technique involving a degenerate case of a signature is directed to an error-detection problem. In particular, a parity bit is a degenerate case of a signature, a case in which the signature has only two possible values. Since the parity bit has only two possible values, the mapping relationship between an m-bit data word and its parity bit is such that each of one-half of the $2^m$ possible values of the m-bit data word maps onto the value 0 for the parity bit, and each of the other half maps onto the value 1.

Another known techniques involving a signature is directed to an error-correction problem. See an article entitled "Optimal Rectangular Code for High Density Magnetic Tapes," by Patel and Hong, which was published in the November 1974 issue of IBM J. Res. Develop. (hereinafter, the Patel and Hong article). The cyclic redundancy check (CRC) check byte described in the Patel and Hong article is an 8-bit signature, and accordingly has 256 possible values. The mapping relationship for this type of signature is based on operations in finite, Galois, fields.

Any element in such a Galois field can be expressed as a polynomial with binary coefficients. Any m-bit long string of binary digits can be expressed as a polynomial of powers of x, with the highest exponent being m-1 and the lowest exponent being 0. In the case where m is four, the string is capable of representing any one of the sixteen hexidecimal digits. As an example, the hexidecimal digit F can be expressed as $x^3+x^2+x+1$. In the case where m is eight, the string is capable of representing any decimal value in the range 0 to 255. As an example, the coded string representing the decimal value 57 can be expressed as $x^5+x^4+x_3+1$.

Certain polynomials are said to be irreducible. For example, an eighth degree polynomial $g_1(x)$ that is irreducible is $x^8+x^5+x^4+x^3+1$. There are fifteen other irreducible polynomials of degree 8. They are listed in the Patel and Hong article at page 585.

As another example, a thirty-second degree polynomial that is irreducible is $x^{32}+x^{22}+x^2+x+1$. Many other such thirty-second degree irreducible polynomials are described in a book entitled *Error-Correcting Codes*, by Peterson and Weldon, published by The MIT Press.

For any irreducible polynomial with binary coefficients, there are a finite number of residue classes modulo the polynomial. For example, the irreducible polynomial $g_1(x)$ above has 17 residue classes. They are: 1; x; $x^2$; $x^3$; $x^4$; $x^5$; $x^6$; $x^7$; $(x^5+x^4+x^3+1)$; $(x^6+x^5+x^4+x)$; $(x^7+x^6+x^5+x^2)$; $(x^7+x^6+x^5+x^4+1)$; $(x^7+x^6+x^4+x^3+x+1)$; $(x^7+x^3+x^2+x+1)$; $(x^5+x^2+x+1)$; $(x^6+x^3+x^2+x)$; and $(x^7+x^4+x^3+x^2)$.

Each residue class $x^i$ modulo g(x) can be ascertained by dividing g(x) into $x^i$ to determine the residue, with coefficient summation modulo 2. The residues are cyclic; for example, the residue $x^{i+17}$ modulo $g_1(x)$ is the same as the residue $x^i$ modulo $g_1(x)$.

With reference again to FIG. 1, there will now be described the mapping relationship that is involved between the two portions of each valid cell defined by the depicted data signal. As stated above, a data block starts at t9. The cell containing that data block also contains a data-dependent boundary-marking code word beginning at t65. The coding of the code word satisfies the following relationship:

$$BMCW = K + \sum_{n=1}^{56} D_n x^{n-1}$$

where K has been arbitrarily chosen to be $(1+x^8)$, note that K can also be expressed as $(x^5+x^4+x^3)$; $D_1$ is the binary value of the youngest bit of the block; $D_2$ is the binary value of the next youngest, etc. $x^i$ is the residue class $x^i$ modulo $g_1(x)$; and the summation is modulo 2 (i.e., exclusive-OR).

For the exemplary data block, each of thirty coefficients such as $D_4$, $D_7$, etc. is 0, and accordingly terms such as $x^3$, $x_6$, etc., are not summed. Separately, numerous pairs of powers of x including the pair x and $x^{52}$, and the pair $x^2$ and $x^{53}$, etc. are such that each element of the pair has the same residue modulo $g_1(x)$, and accordingly cancel.

After such cancellations, the summation consists of the following terms: $x^3+x^4+x^8+x^{11}+x^{12}+x^{16}$. These can be further reduced by replacing each of certain terms with its residue class; for example, $x^8$ is replaced by $(x^5+x^4+x^3+1)$. Such replacement and further summing modulo 2 results in the following polynomial: $(x^7+x^4+x^2+x+1)$. This polynomial gives the coding for the code word 10010111, the oldest bit of which is at t65.

Figure 3:
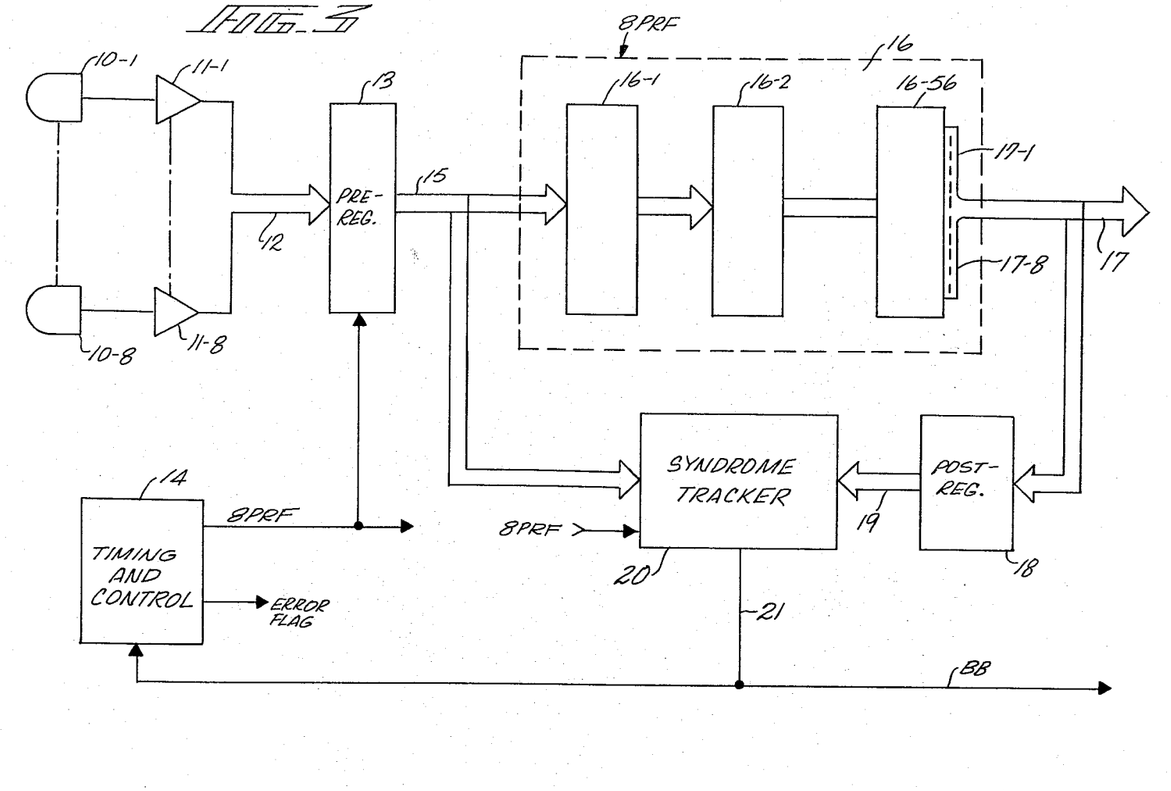
FIG. 3 is a block diagram of a system in which a serial-by-byte data signal is applied to a decoder embodying the invention.

With reference to FIG 3, there will now be described a first embodiment of the present invention. This first embodiment is a decoder for a serial-by-byte data signal, each byte of which consists of 8 parallel bits.

The data signal is derived from a record member (not shown) such as a multi-track magnetic tape. A set of eight read heads 10-1 through 10-8 (not all shown) communicate information read from the record member to a set of eight amplifiers 11-1 through 11-8 (not all shown). The outputs of the eight amplifiers are connected by a signal bus 12 to a parallel-load input of a pre-register 13.

The parallel-by-bit signal on bus 12 defines information, including data bits and redundancy bits, at spaced points in time, each of which is at the same phase of a bit rate frequency (BRF). However, the signal is characterized by a tolerance with respect to the particular phase involved. Accordingly, the signal is sampled, as described in more detail below, at a multiple of the bit rate frequency. A clock signal 8BRF is provided by a timing and control unit 14 to control the sampling.

Each pulse of the clock signal causes pre-register 13 to copy in parallel the then-current binary values of the eight signals carried by bus 12. During the interval between samples, the most recently copied binary values are defined by a parallel-by-bit signal on a bus 15 connecting pre-register 13 to, among other things, an arrangement 16 of block-congregating registers. Pre-register 13 and arrangement 16 in combination constitute a first-in, first-out register (FIFO) means through which the data signal propagates to an external utilization system.

Within arrangement 16, there are 56 registers 16-1 through 16-56 (not all shown). Each of these registers is clocked by the 8BRF clock signal, and in response to each clock pulse copies the then-current binary values of eight parallel signals applied to its parallel load input. A signal bus 17 comprising signal leads 17-1 through 17-8 (not all shown) is connected to the output of register 16-56 to supply bytes, one by one, to the external utilization system.

The propagation of parallel-by-bit bytes is such that the individual signal derived by head 10-1 propagates to signal lead 17-1, that derived by head 10-2 propagates to 17-2, etc. through that derived by head 10-8 propagates to 17-8. A data byte stored in pre-register 13 is referred to herein as the youngest byte of a candidate cell. A data byte stored in register 16-56 is referred to herein as the oldest byte of a candidate cell. A byte which at a particular instant is the youngest byte will after 56 clock pulses become the oldest byte. The relative ordering of bits within a byte is preserved throughout the propagation. Thus, the most significant bit of the byte at the read head stage is read by read head 10-1, and the most significant bit of the byte at the output bus stage is carried by signal lead 17-1.

A post-register 18 is provided for storing overflow bytes one at a time as they exit from the FIFO register means. The overflow byte currently stored in register 18 is applied via a bus 19 as one input to a syndrome tracker 20, which is depicted in more detail in FIG. 4. The youngest byte currently stored in pre-register 13 is applied via bus 15 as another input to syndrome tracker 20.

Before proceeding further with the description of the construction of the decoder of FIG. 3, there will now be described certain matters relating to the coding of the data signal derived from the record member. When sampled at the proper phase, the parallel-by-bit signal on bus 12 sequentially defines a plurality of multi-bit cells. Each cell includes 7 data bytes and an eighth byte of redundancy bits constituting the data-dependent boundary-marking code word (BMCW) for that cell. The coding of the BMCW satisfies the following mapping relationship:

$$BMCW = \sum_{i=1}^{7} T^i B_i$$

where T is the companion matrix of the polynomial $g_1(x)$;

$B_1$ is the youngest byte of the block, $B_2$ is the next youngest, etc. through $B_7$ which is the oldest byte of the block.

Consider now a representative example in which a data block consists of the following 7 bytes (each eight-bit byte being listed here as a pair of hexadecimal digits): B7=79; B6=55; B5=84; B4=36; B3=81; B2=56; B1=37. The following table lists the individual results of the seven matrix transformations and the final sum:

TABLE I

| | MS | | | | | | LS | | |
|---|---|---|---|---|---|---|---|---|---|
| $T^7 (79)_H$ | 1 | 1 | 0 | 0 | 0 | 0 | 0 | 1 | = $(C1)_H$ |
| $T^6 (55)_H$ | 0 | 1 | 0 | 0 | 0 | 1 | 1 | 0 | = $(46)_H$ |
| $T^5 (84)_H$ | 0 | 1 | 0 | 1 | 1 | 0 | 1 | 1 | = $(5B)_H$ |
| $T^4 (36)_H$ | 0 | 0 | 1 | 0 | 1 | 0 | 1 | 1 | = $(2B)_H$ |
| $T^3 (81)_H$ | 1 | 1 | 1 | 0 | 1 | 1 | 0 | 0 | = $(EC)_H$ |
| $T^2 (56)_H$ | 0 | 1 | 1 | 0 | 0 | 0 | 0 | 1 | = $(61)_H$ |
| $T^1 (37)_H$ | 0 | 1 | 1 | 0 | 1 | 1 | 1 | 0 | = $(6E)_H$ |
| BMCW = | 0 | 0 | 0 | 1 | 0 | 1 | 0 | 0 | = $(14)_H$ |

Consider now the circumstances existing when the exemplary data block described above has been congregated within arrangement 16. The oldest byte B7 is stored in register 16-56, byte B6 is stored in register 16-48, byte B5 is stored in register 16-40, byte B4 is stored in register 16-32, byte B3 is stored in register 16-24, byte B2 is stored in register 16-16, byte B1 is stored in register 16-8, and BMCW is stored in pre-register 13.

Under these circumstances, syndrome tracker 20 will cause a block boundary (BB) signal that it generates to be true.

To generate the BB signal, syndrome tracker 20 includes translator means and gating means that cooperate to test each of a sequence of candidate cells as they propagate through the FIFO memory means to determine, as each candidate cell undergoes testing, whether its block-length portion stored within arrangement 16 bears the predetermined mapping relationship to its code-word-length portion stored in pre-register 13.

In this first embodiment, the translator means and the gating means are arranged to generate a succession of syndrome words in synchronism with the operation of the FIFO register means. Each such generated syndrome word satisfies the following relationships:

$$S_n = B_y + TS_{n-8} + T^8 BOVF$$

where $B_y$ is the youngest byte (which is stored in pre-register 13);

$S_{n-8}$ is the syndrome that was generated 8 clock pulses (of the 8 BRF clock) earlier; and BOVF is the overflow byte (which is stored in post-register 18).

If, as to the candidate cell undergoing testing, its block-length portion bears the predetermined mapping relationship to its code-word-length portion, the generated syndrome word is all zeroes.

Figure 4:
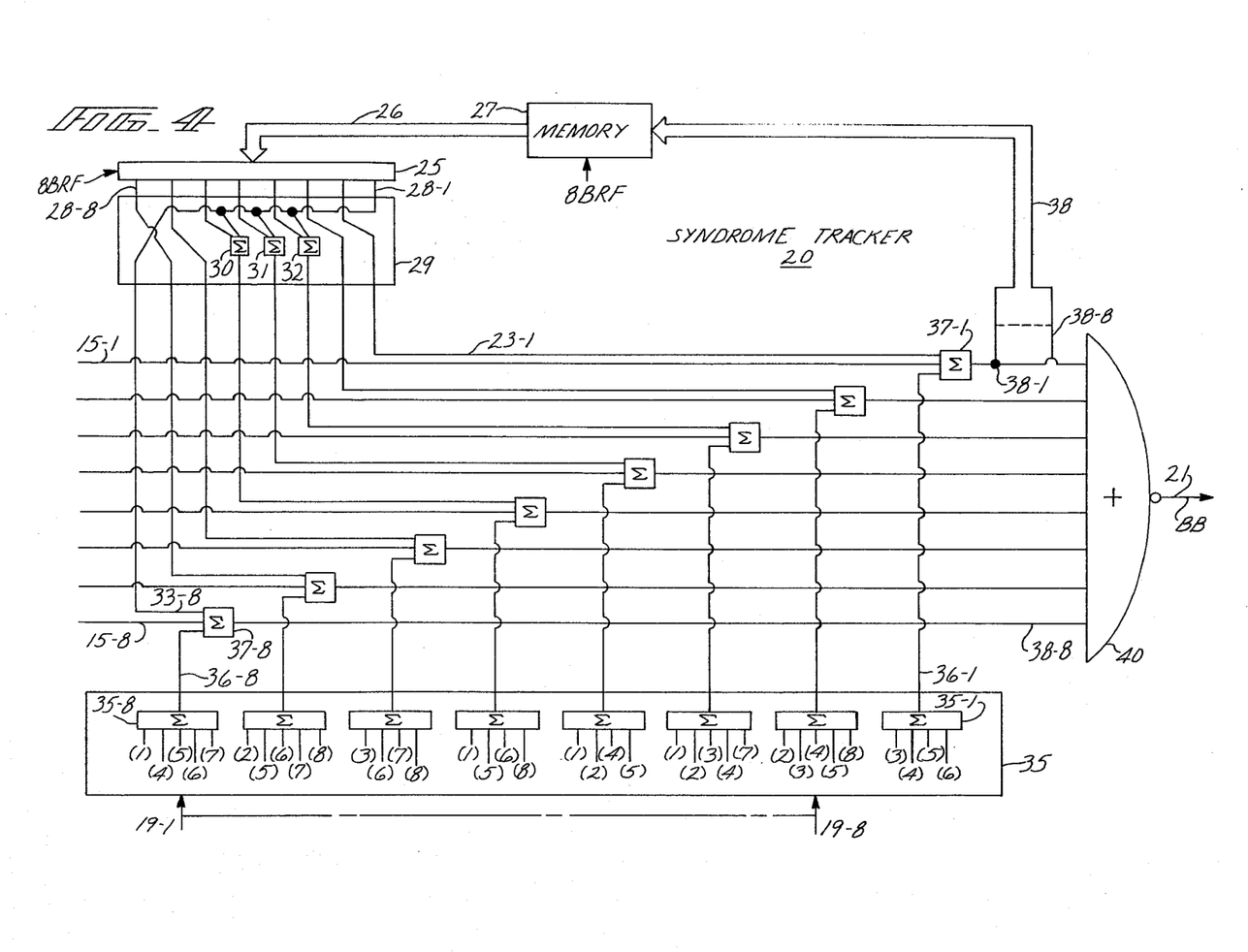
FIG. 4 is a more detailed block diagram of a syndrome tracker used in the system of FIG. 3.

With reference now to FIG. 4, syndrome tracker 20 is shown in more detail as including a register 25 for storing a previously generated syndrome word that is to be updated (i.e., $S_{n-8}$). Register 25 has a parallel-load input and is clocked by the 8 BRF clock signal. A bus 26 connects the parallel-load input of register 25 to the output of a memory 27 comprising 7 registers (not separately shown) that are connected in the same manner as the registers of arrangement 16.

Individual leads 28-1 through 28-8 carry $S_{n-8}$ from register 25 to a translator 29 for generating $TS_{n-8}$, which in an 8-bit wide parallel-by-bit signal representing a component term of a signature of the block-length portion of the candidate cell undergoing testing. Within translator 29 there are three exclusive-OR gates 30, 31, and 32, each of which has one of its two inputs connected to signal lead 28-1. The output of translator 29 is applied to signal leads 33-1 through 33-8. The most significant bit of $S_{n-8}$ is applied to signal lead 28-1 which is directly connected via translator 29 to signal lead 33-8 so as to define the least significant bit of the output of translator 29 (i.e., $TS_{n-8}$).

A separate translator 35 responds to the overflow byte to generate $T^8$ BOVF, which is an 8-bit wide parallel-by-bit signal representing another component term of the signature of the block-length portion of the candidate cell undergoing testing. The output of translator 35 is applied to signal leads 36-1 through 36-8. Translator 35 comprises eight exclusive-OR gates 35-1 through 35-8. Signal leads connect the inputs of these gates to bus 19. For clarity of depiction, these signals leads are indicated by numbers within parentheses. Thus, the numbers within the parentheses shown below gate 35-1 indicate that its inputs are connected to signal leads 19-1, 19-4, 19-5, 19-6, and 19-7 of bus 19.

A gating arrangement 37 comprising exclusive-OR gates 37-1 through 37-8 combines the two above-described parallel-by-bit signals with the youngest byte of the candidate cell being tested to generate an updated syndrome word on bus 38. A NOR gate 40 generates the block boundary (BB) signal, and causes it to equal 1 when the updated syndrome word is all zeroes.

A representative example of operation of this first embodiment will now be described. In this representative example, the record member stores, in order, a preliminary string of bytes that are each all zero, followed by two identical cells. Each cell comprises 7 data bytes followed by the boundary-marking code word. Generally, in the following description, pairs of hexidecimal digits are used to describe the bytes. In such hexidecimal notation, the data bytes of the two identical cells are, in oldest to youngest order, 79, 55, 84, 36, 81, 56, 37, and 14.

In this representative example, at times t0, t8, t16, etc., the data signal on bus 12 defines the data bytes. With the preliminary string of all-zero bytes in the FIFO register means, register 25 also stores in all-zero byte. When the oldest byte (79) of the first of the two identical cells is stored in pre-register 13, the following operation occurs. Gating arrangement 37 generates an updated syndrome word which is carried by bus 38 to memory 27. The updated syndrome word, expressed in hexidecimal digits, is 79.

The ensuing series of clock pulses of the 8 BRF clock signal cause the updated syndrome word to propagate back toward register 25, and arrive there at time t8. At that time, the next oldest byte (55) is stored in pre-register 13. At this point, the binary values of pertinent signals are as set forth in the following table:

TABLE II

|  | −1 | −2 | −3 | −4 | −5 | −6 | −7 | −8 | (Hexi) |
|---|---|---|---|---|---|---|---|---|---|
| bus 28 | 0 | 1 | 1 | 1 | 1 | 0 | 0 | 1 | (79) |
| bus 33 | 1 | 1 | 1 | 1 | 0 | 0 | 1 | 0 | (F2) |
| bus 15 | 0 | 1 | 0 | 1 | 0 | 1 | 0 | 1 | (55) |
| bus 36 | 0 | 0 | 0 | 0 | 0 | 0 | 0 | 0 | (00) |
| bus 38 | 1 | 0 | 1 | 0 | 0 | 1 | 1 | 1 | (A7) |

The value F2 defined on bus 33 is $T^1[(79)_H]$. The value A7 defined on bus 38 is the updated syndrome; it is the exclusive-OR sum, bit-by-bit, of the values F2, 55, and 00.

The following table gives the hexidecimal values for the foregoing signals at each of the times $t_0$, $t_8$, etc.

TABLE III

| Time | Buses 28 | 33 | 36 | 15 | 38 |
|---|---|---|---|---|---|
| 0 | 00 | 00 | 00 | 79 | 79 |
| 8 | 79 | F2 | 00 | 55 | A7 |
| 16 | A7 | 77 | 00 | 84 | F3 |
| 24 | F3 | DF | 00 | 36 | E9 |
| 32 | E9 | EB | 00 | 81 | 6A |
| 40 | 6A | D4 | 00 | 56 | 82 |
| 48 | 82 | 3D | 00 | 37 | 0A |
| 56 | 0A | 14 | 00 | 14 | 00 |
| 64 | 00 | 00 | BB | 79 | C2 |
| 72 | C2 | BD | 21 | 55 | C9 |
| 80 | C9 | AB | AA | 84 | 85 |
| 88 | 85 | 33 | C2 | 36 | C7 |
| 96 | C7 | B7 | 77 | 81 | 41 |
| 104 | 41 | 82 | 6A | 56 | BE |
| 112 | BE | 45 | FB | 37 | 89 |
| 120 | 89 | 2B | 3F | 14 | 00 |

Note that at times t56 and t120, the updated syndrome defined on bus 38, is zero. At each of these times, arrangement 16 has stored in it the data block and pre-register 13 has stored in it the boundary-marking code word. Thus, at each of those times, the BB signal defines a candidate-valid signal.

In the illustrated embodiment, the BB signal is applied to timing and control unit 14 to control the generation of an error flag signal produced by timing and control unit 14. Suitably, timing and control unit 14 includes a timing counter (not shown) that counts the pulses of the 8 BRF clock signal, and that is reset each time the BB signal defines a candidate-valid signal. If a sufficiently long interval elapses without the timing counter being reset, then the error flag signal defines a candidate-invalid signal. As has been hereinbefore noted, it is advantageous to supply such a candidate-invalid signal to external error-correcting circuitry.

With reference to FIG. 5, there will now be described a second embodiment of the present invention. This second embodiment is a record/playback system for storing on a storage medium such as magnetic tape, and subsequently deriving the stored information from the storage medium. In this embodiment a data signal is encoded in serial-by-bit format, stored on the storage medium, and derived from the storage medium in serial-by-bit format.

To avoid cluttering the drawings with subordinate detail, the storage medium and related components such as read heads are not shown. Separately, certain control switches for controlling whether the system is in an encode mode or decode mode are not shown.

When the system is operated in an encode mode and used for encoding an analog-audio signal, an analog-to-digital (A/D) converter 50 responds to the analog-audio signal to provide a corresponding 8-bit wide serial-by-bit digital signal on a bus 51. Bus 51 connects the output of A/D converter 50 to a buffer memory 52 and to a buffer memory 53. A suitable arrangement of registers and gates for carrying out the functions of these buffer memories is shown in more detail in FIG. 7. Briefly, one of the two buffer memories is alternately used to collect seven samples (i.e., 56 bits) of the signal defined on buffer 51, and meanwhile, the other buffer memory is supplying on its output a serial-by-bit signal defining fifty-six consecutive bits of data.

An OR gate 54 receives the outputs of buffer memories 52 and 53 and has its output connected to an AND gate 54. Another input to AND gate 55 is a control lever (encode mode) that is caused to be true during the encoding mode of operation of the system by control switches (not shown). The output of AND gate 55 is connected to one end of an OR gate 56 whose output is connected to the shift-in input of a pre-register 57.

In one embodiment of this record/playback system, pre-register 57 has eight flip-flops. In a preferred embodiment described in more detail subsequently, preregister 57 has thirty-two flip-flops.

Pre-register 57 has a shift-out output that is connected to a block-congregating register 58. In the second embodiment, block-congregating register 58 has fifty-six flip-flops which accordingly correspond to the number of bits in a data block in the second embodiment. In the preferred embodiment described below, block-congregating register 58 has two hundred and fifty-six flip-flops for storing a data block having that number of bits.

Pre-register 57 and block-congregating register 58, in combination, constitute a first-in, first-out register means for storing each of the succession of candidate cells. During an encoding mode of operation, seven samples, each 8 bits long, of the analog signal propagate into register 58 and, through operation of a signature tracker 59, a boundary-marking code word is generated and loaded in parallel via a bus 60 into pre-register 57. Bits are shifted out one at a time from the FIFO register means via signal lead 61 to an AND gate 62. During the encoding mode of operation the output of AND gate 62 on signal lead 63 is a digital output suitable for application to recording amplifiers for a write subsystem (not shown).

To control the timing of the loading of the code word into pre-register 57, the system suitably includes a counter 64 that is responsive to a bit rate clock (BRC) provided by a clock signal source (not shown). Counter 64 is organized to count from a zero count, 00 in hexadecimal, to a maximum count, 3F in hexidecimal, and then recycle. A decoder 65 produces a pulse on signal lead 66 each time counter 64 defines the 3F count. An AND gate 67 responds to the output of decoder 65, the output of an inverter 68 that complements the bit rate clock, and to the encoder mode signal. In response to these signals, AND gate 67 produces a write load (WL) that is applied to pre-register 57 to cause it to copy in parallel the bits then present on bus 60.

In the decoding mode of operation of the system, a digital-audio signal derived from the reading out of the record member is applied to the AND gate 69 via a signal lead 70. The output of AND gate 69 is connected to OR gate 56 so as to propagate the digital-audio signal, during the decoding mode, to the shift-in input of pre-register 57. During the decoding mode the digital-audio signal propagates through the FIFO register means such that at each of a succession of spaced points in time (i.e., once per clock signal of the bit rate clock) the FIFO register means has stored in it a respective one of a succession of candidate cells. Each such candidate cell includes a block-length portion and a code-word-length portion. In this second embodiment, the block-length portion is fifty-six bits long and is stored in register 58, and the code-word-length portion is eight bits long and is stored in preregister 57.

Testing means in the system successively test, in synchronism with the FIFO register means, each of the candidate cells to determine whether its code-word-length portion bears a predetermined mapping relationship to its block-length portion.

In the second embodiment the mapping relationship is such that it satisfies the relationship given above in connection with the description of FIG. 1.

Consider now a representative example of a decoding operation involving a detection of the boundary-marking code word (BMCW) of the data signal depicted in FIG. 1. At the time that the data block starting at t9 is congregated in register 58, the BMCW is stored in pre-register 57. At this time, signature tracker 59 will generate a check code word that is bit-by-dit identical to the BMCW stored in pre-register 57. A compare gating arrangement 61 detects this identity and causes a block boundary (BB) signal it generates to equal 1.

Figure 6:
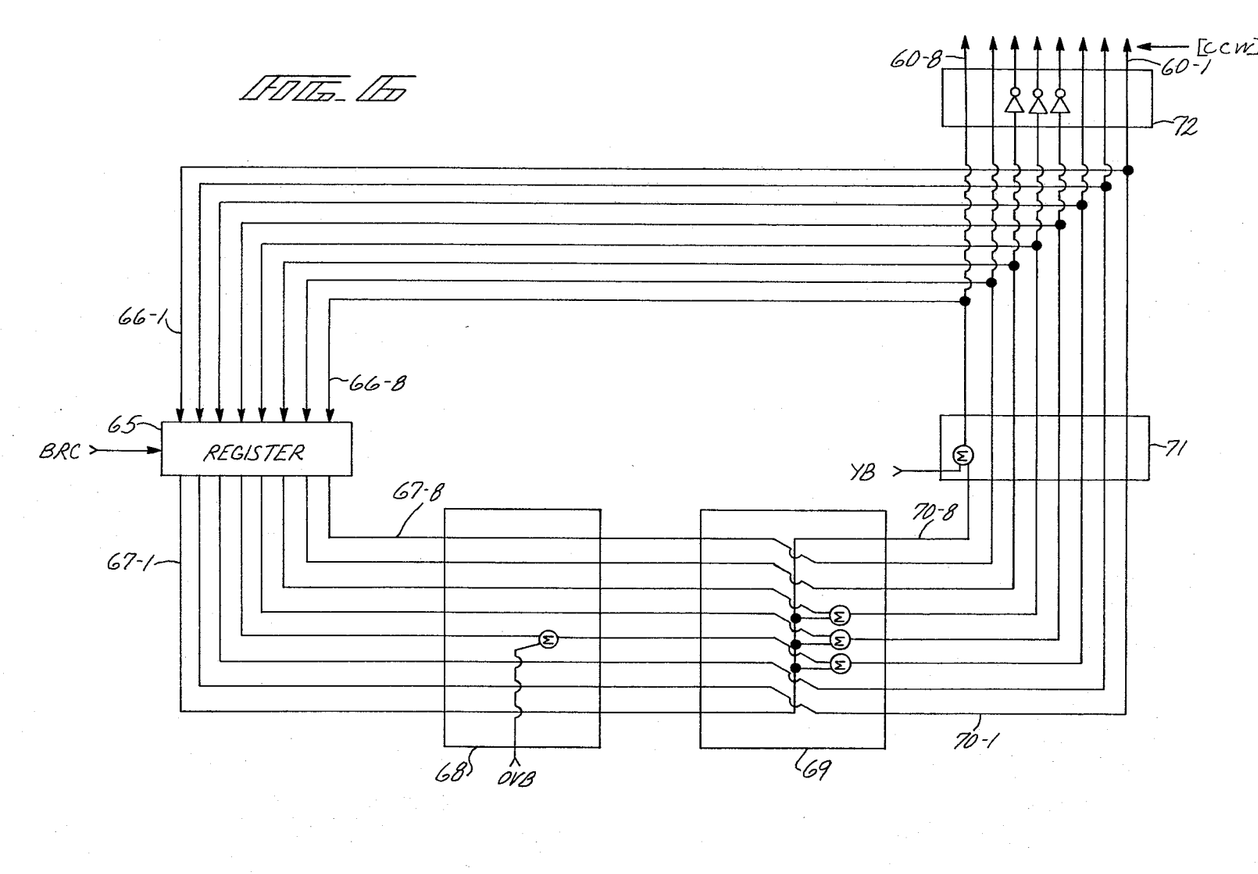
FIG. 6 is a more detailed block diagram of parts of the system of FIG. 5.

Compare gating arrangement is connected to preregister 57 by a bus 62 and is connected to signature tracker 59 by bus 60, which comprises signal leads 60-1 through 60-8 (FIG. 6).

To generate the check code word, signature tracker includes means shown in FIG. 6 that respond to an overflow bit (BOVF) applied to it from an overflow flip-flop 63, and to a youngest bit (YB) applied to it from the first-stage flip-flop of register 58.

With reference to FIG. 6, signature tracker 59 is shown as including a register 65 for storing an outdated signature word. Register 65 has a parallel-load input and is clocked by the BRC clock signal.

A bus 66 comprising signal leads 66-1 through 66-8 is connected to the parallel-load input of register 65. A bus 67 comprising signal leads 67-1 through 67-8 is connected to the output of register 65.

A summing arrangement 68 is connected in tandem with a translator 69 so that, in combination, arrangement 68 and translator 69 cooperate to generate a translated word which is applied to a bus 70. Bus 70 comprises signal leads 70-1 through 70-8 and is connected to the input of a summing arrangement 71 for producing an updated signature word. The output of summing arrangement 71 is connected to bus 66 to feed back the updated signature word to register 65, and to provide the updated signature word to a gating arrangement 72. The ouput of gating arrangement 72 is connected to bus 60. The following relationship exists between the updated signature word, on the one hand, and, on the other hand, the youngest bit, the outdated signature word, and the overflow bit:

$$USW = YB + x(ODSW - OVBx^{55})$$

where USW is the updated signature word (which is fed back for storage in register 65 to replace the outdated signature word);
YB is the youngest bit (which is stored in the input flip-flop of register 58);
ODSW is the outdated signature word;
OVB is the overflow bit (which is stored in OVF 63); and
where multiplication is carried out modulo $g_1(x)$.

It should be noted that the residue class $x^{55}$ modulo $g_1(x)$ is identical to the residue class of $x^4$ modulo $g_1(x)$. In view of the foregoing and from inspection of FIG. 6, it will be appreciated that summning arrangement 68 carries out the function of modifying the outdated signature word in accordance with the terms included in the parentheses of the foregoing relationship. It will also be appreciated that translator 69 performs the function of multiplying by x modulo $g_1(x)$, and that summing arrangment 71 carries out the function of summing, modulo 2, so as to include the youngest bit term of the foregoing relationship.

A representative example of the decoding operation of this second embodiment will now be described. In this representative example, the record member stores, in order, a preliminary string of bits, the last of which is the oldest bit depicted at t0 in FIG. 1, followed by the rest of the sequence of bits depicted in FIG. 1. The preliminary string of bits constitutes a data block, and the bits at t1 through t8 constitute the BMCW for the cell containing that data block. The fourteen 4-bit bytes of the preliminary block are expressed in hexidecimal and with the oldest such byte being listed first: 8, 4, 2, 8, 2, 4, 8, 1, 4, 8, 1, 2, 4, and 8.

At the point in time designated t8 in FIG. 1, the contents of pre-register 57 are, proceeding from left to right as the oldest bit to the youngest bit in the preregister, 01011100. In hexidecimal notation these bits represent 5C. It should be noted that these bits are the BMCW for the above-described preliminary data block.

At time t8, the binary values of pertinent signals are as set forth in the following table:

TABLE IV

| | −1 | −2 | −3 | −4 | −5 | −6 | −7 | −8 | (Hexi) |
|---|---|---|---|---|---|---|---|---|---|
| bus 67 | 0 | 0 | 1 | 1 | 0 | 0 | 1 | 0 | (32) |
| bus 70 | 0 | 1 | 1 | 0 | 0 | 1 | 0 | 0 | (64) |
| bus 66 | 0 | 1 | 1 | 0 | 0 | 1 | 0 | 0 | (64) |
| bus 60 | 0 | 1 | 0 | 1 | 1 | 1 | 0 | 0 | (5C) |

Since at time t8 the check code word defined on bus 60 is bit-by-bit identical to the then-current candidate BMCW stored in pre-register 57, compare gating arrangement 61 causes its BB output signal to be true.

The next ensuing clock pulse of the BRC clock signal causes the FIFO register means to shift and thereby congregate a new candidate shell. It also causes register 65 to copy the most recently updated signature word which is now outdated. In this example, the oldest bit of the prior block is a 1, and accordingly it sets the overflow flip-flop 63 when it is shifted out. On the other hand, the oldest bit of the prior BMCW is a 0, and accordingly it resets the input stage of register 58 when it is shifted in. Thus, at time t9, the binary values of pertinent signals are as set forth in the following table:

TABLE V

|  | −1 | −2 | −3 | −4 | −5 | −6 | −7 | −8 | (Hexi) |
|---|---|---|---|---|---|---|---|---|---|
| bus 67 | 0 | 1 | 1 | 0 | 0 | 1 | 0 | 0 | (64) |
| bus 70 | 1 | 1 | 1 | 0 | 1 | 0 | 0 | 0 | (E8) |
| bus 66 | 1 | 1 | 1 | 0 | 1 | 0 | 0 | 0 | (E8) |
| bus 60 | 1 | 1 | 0 | 1 | 0 | 0 | 0 | 0 | (D0) |

Thus, at time t9, the check code word is D9, whereas the candidate BMCW is B8. Since these two are not bit-by-bit identical, compare gating arrangement 61 causes its BB output to be false.

Ensuing clock pulses cause the generation of the following sequence of check code words: D0 (at t10), D1, D2, D4, F8, 81, 73, AE, 2C, 31, 2B, 3F, 36, 24, 01, 4A, DD, EB, A6, 3D, 13, 6E, 95, 7A, BC, 09, 5A, FC, 88, 61, AA, 25, 22, OD, 53, CE, EC, A8, 21, OB, 5E, F4, B9, 03, 4E, F4, 98, 41, EB, A7, 3E, 14, 61, 8B, 67, 86, 5D, F3, B6, 3D, 13, and 6F (at t71). At no point during the interval involved in the foregoing does the candidate BMCW stored in pre-register 57 match the generated check word. However, at t72, the generated check word is 97 and the candidate BMCW is also 77, and because of this match, compare gating arrangement 61 again causes its BB output to be true to idicate that the present contents of register 58 constitutes a valid block.

Figure 7:
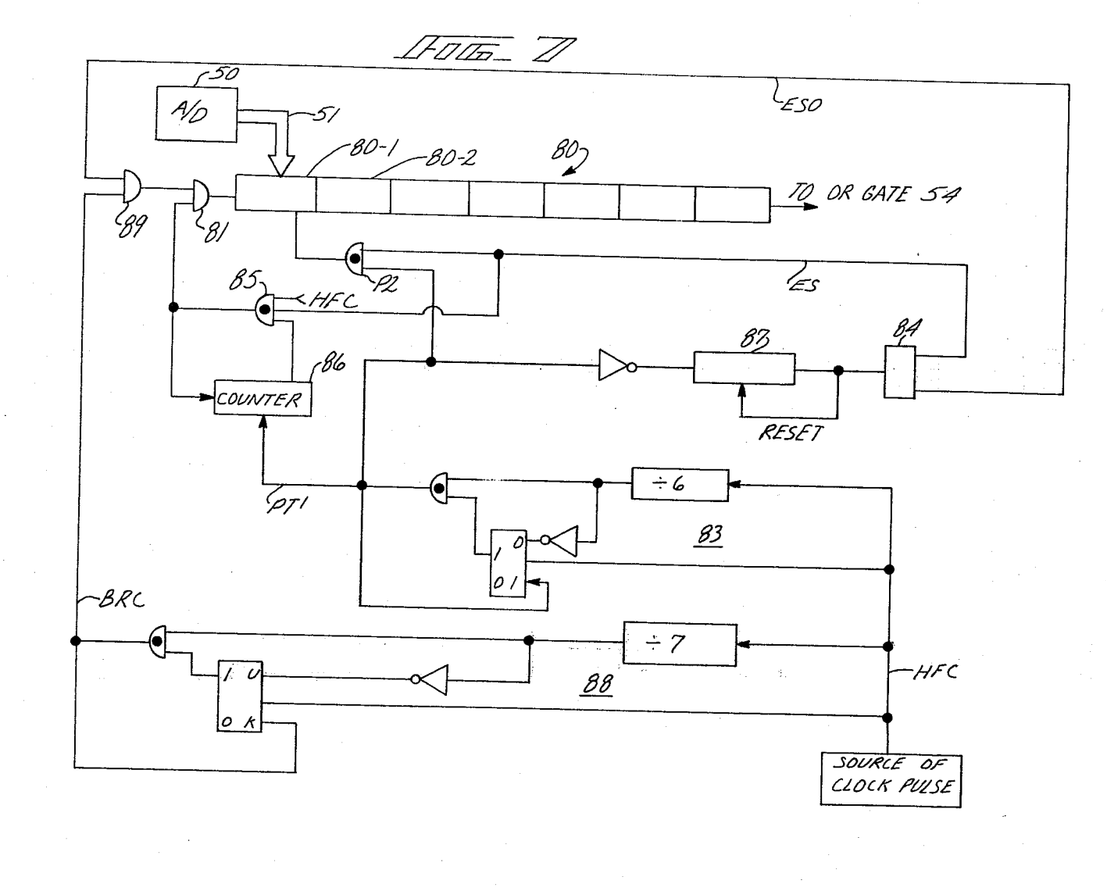
FIG. 7 is a more detailed block diagram of other parts of the system of FIG. 5.

With reference to FIG. 7, there will now be described a suitable arrangement of registers, gates, and the like involved in carrying out the functions of buffer memories 52 and 53.

A shift register 80 comprising 56 flip-flops (not individually shown) has seven sections each comprising eight flip-flops. An input section 80-1 has a parallel-load input connected to bus 51, a clock input connected to the output of an OR gate 81 and a load input connected to the output of an AND gate 82.

Each time the output signal (sample P) of AND gate 82 is true, input section 80-1 copies the 8-bit wide signal defined on bus 51. A suitable sampling rate is 70 kilohertz. An arrangement generally indicated at 83 responds to a high frequency clock signal (HFC) to produce a pulse train (PT1) defining narrow pulses occurring at 70K pulses per second.

Shift register 80 is part of buffer memory 52. An identical shift register (not shown) is part of buffer memory 53. While buffery memory 52 is being used to collect seven consecutive samples, an enable sample (ES) signal is true. This signal is provided by a flip-flop 84 and applied to control the operation of gate 82, and the operation of an AND gate 85.

A counter 86 comprises four flip-flops (not separately shown), and counts pulses produced by AND gate 85.

Counter 86 has a presetting input for receiving the sample pulses of the PT1 pulse train. Each pulse of the PT1 pulse train presets counter 86 to a count of 8 (i.e., 1 in its most significant flip-flop and 0 in each of its other flip-flops). While the output of the most significant flip-flop is 1 and the ES signal is 1, pulses of the HFC pass through gate 85. These pulses occur at 64 times the pulse rate of the sample pulses of the PT1 pulse train. In this specific embodiment, the HFC pulse rate is 4.48 megahertz. The eighth pulse to pass through gate 85 causes counter 86 to return to an all zero count. Accordingly, no additional pulses pass through gate 85 until another sample pulse occurs.

The eight high frequency pulses produced per sample pulse cause the contents of section 80-1 to shift to the next section 80-2.

A separate counter 87 keeps track of the number of samples that have been collected in shift register 80. When it reaches a count of seven, it resets itself via the depicted feedback path, and also causes flip-flop 84 to change states. To summarize and somewhat amplify on the foregoing, seven consecutive sample pulses cause seven consecutive samplings of the signal defined on bus 51, and the high-speed shifting operation causes the first sampling to propagate to section 80-7, the second to section 80-6, etc. With shift register 80 fully loaded with seven samplings, flip-flop 84 changes state to enable the corresponding shift register of buffer memory 53 to collect the next seven samplings in the same manner. Meanwhile, the seven samplings collected in shift register 80 are shifted out in the manner described below.

An arrangement generally indicated at 88 responds to the HFC to produce the BRC (Bit Rate Clock) pulse train. In this specific embodiment, the BRC pulse rate is 640 kilohertz. An AND gate 89 propagates the pulses of the BRC pulse train to cause the bit-by-bit shift out while the ESO (Enable Shift Out) signal produced by flip-flop 84 is true. The bits so shifted out are applied to OR gate 54 (FIG. 5).

Because of the ratio between their pulse repetition rates, the BRC pulse train defines 64 pulses during an interval in which the PT1 pulse train defines seven sample pulses. Thus, while one of the two buffer memories is collecting seven samples, the other buffer memory is communicating with the FIFO register means by shifting out a cell-long string comprising 56 data bits and eight trailing zeros. When the 56 data bits have been congregated in register 58, the WL signal causes the check word output signal of signature tracker 59 to be loaded in parallel into pre-register 57 to overwrite the eight trailing zeroes.

As stated above, a preferred embodiment of the record/playback system employs a longer data block and a longer BMCW. It will be appreciated that by using a longer BMCW there is a smaller probability of an unintended coincidental match between a generated check code word and a portion of a data block. More significantly, using a longer BMCW likewise reduces the probability of failing to generate an error flag for a bad block. With a 32-bit BMCW and with a suitable mapping relationship, the probability is about one chance in four billion. A suitable mapping relationship for a 256-bit data block, 32-bit BMCW combination cell involves the irreducible polynominal $g_2(x) = x^{32} + x^{22} + x^2 + x + 1$. Signature tracker 59 can be modified as follows for the purposes of employing this mapping relationship. Register 65 and each of the buses within the signature tracker will of course be 32 bits wide. Bus 67, for example, would have 32 signal leads 67-1 through 67-32, with lead 67-1 carrying the most significant bit of the outdated signature word and lead 67-32 carrying the least significant bit.

As for summing arrangement 68, note first that the residue classes $x^{255}$ modulo $g_2(x)$ has 17 terms, viz, $x^{31} + x^{27} + x^{25} + x^{23} + x^{20} + x^{19} + x^{17} + x^{16} + x^{13} + x^{11} + x^{10} + x^9 + x^7 + x^6 + x^4 + x^2 + 1$. Accordingly, summing arrangement 68 would have 17 exclusive-OR gates, each having one input connected to receive the overflow bit (OVB). The other inputs of these exclusive-OR gates would be connected to signal leads 67-1, 67-5, 67-7, 67-9, 67-12, 67-13, 67-15, 67-16, 67-19, 67-21, 67-22, 67-23, 67-25, 67-26, 67-28, 67-30, and 67-32, respectively. As for translator 69, it would provide connection paths such that lead 70-1 is connected to lead 70-32, and is connected to three exclusive-OR gates having outputs connected to leads 70-10 (for the $x^{22}$ term), 70-30 (for the $x^2$ term), and 70-31 (for the x term). The other connection paths would provide for increasing the order of significance of the output bits in the same manner as the translator 69 depicted in FIG. 6.

Figure 8:
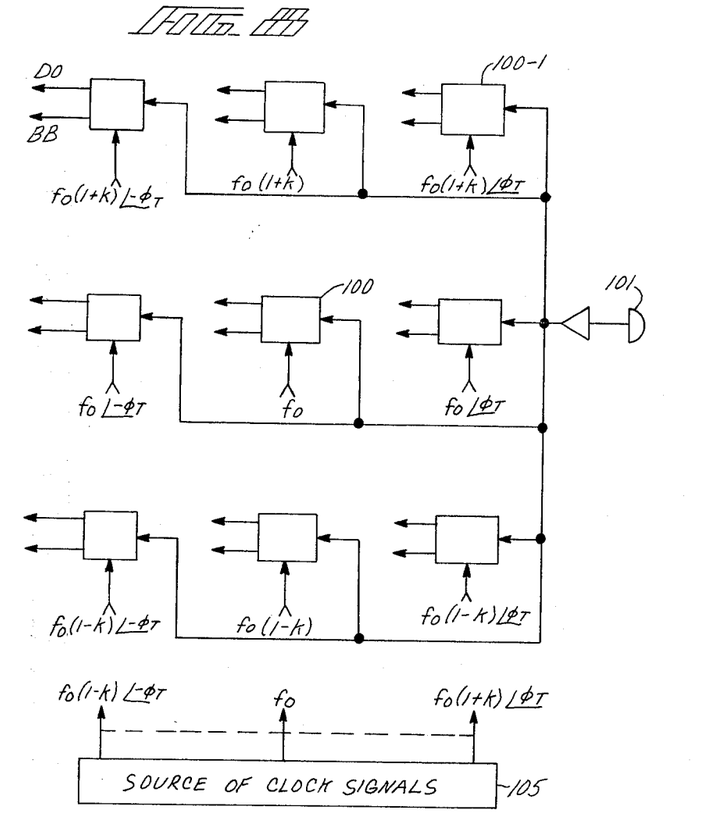
FIG. 8 is a block diagram showing a system comprising a plurality of decoders such as the decoder of FIG. 5 to process a data signal having a tolerance with respect to the points in time at which it defines information.

The portion of the system of FIG. 5 that is involved in the decode mode of operation is advantageously incorporated as a basic building block 100 of the system of FIG. 8. As shown in FIG. 8, a matrix of nine building blocks each receive a data signal derived from head 101. A source of clock signals 105 generates nine individually identifiable clock signals defining various frequencies and phases. One such clock signal $f_o$ has the design center frequency and the design center phase for recovering data bits from the data signal. The data signal is characterized by a tolerance of $\pm k\%$ as to bit rate frequency, and by a tolerance of $\pm \phi t$ as to phase. Thus, when, for example, the data signal is at one end of these tolerances such as being k% high in frequency and $+\phi t$ degrees shifted in phase, building block 100-1 provides bit-synchronous decoding of the data signal.

What is claimed is:

1. A process for decoding a data signal defining information, including data bits and redundancy bits, at spaced points in time, the data signal being characterized by a tolerance with respect to the points in time at which it defines the information, and being further characterized in that the data bits represent a plurality of blocks and the redundancy bits represent a plurality of data-dependent code words, each such code word bearing a predetermined mapping relationship to a respective one of the blocks and otherwise being indistinguishable from any arbitrarily selected groups of data bits, the process comprising the steps of:
   (a) forming a plurality of individually identifiable clock signals, each such clock signal having reoccurring clock pulses therein, the clock pulses of each such clock signal differing from those of each other clock signal as to time of occurrence;
   (b) sampling the data signal upon occurrence of the clock pulses to derive a plurality of sample bits;
   (c) congregating a multiplicity of groups of sample bits as candidate cells, each such candidate cell including a block-length portion and a code-word-length portion with all sample bits of both portions being derived from the same clock signal;
   (d) testing each of the multiplicity of candidate cells to determine, as each candidate cell undergoes testing, whether its code-word-length portion bears the predetermined mapping relationship to its block-length portion as is characteristic of a valid cell; and
   (e) generating a candidate-valid signal for each candidate cell that upon testing is determined to be a valid cell.

2. A process as defined in claim 1, wherein the clock pulses of at least one clock signal occur at a different pulse repetition frequency from the clock pulses of at least one other clock signal.

3. A process as defined in claim 1, wherein the clock pulses of at least two clock signals occur at the same pulse repetition frequency but are shifted in phase relative to each other.

4. A process as defined in claim 1, wherein the testing step includes the step of generating a syndrome word comprising n bits to provide an indication of whether, for the candidate cell undergoing testing, said predetermined mapping relationship exists; and wherein the step of generating the candidate-valid signal includes the step of decoding the syndrome word.

5. A process as defined in claim 1, wherein the testing step includes the steps of translating the m-bit portion of the candidate cell undergoing testing to generate a check code word, and comparing the n-bit portion of the candidate cell undergoing testing with the generated check code word.

6. Apparatus for decoding a data signal defining information, including data bits and redundancy bits, at spaced points in time, the data signal being characterized by a tolerance with respect to the points in time at which it defines the information and being further characterized in that the data bits represent a plurality of blocks and the redundancy bits represent a plurality of data-dependent code words, each such code word bearing a predetermined mapping relationship to a respective one of the blocks and otherwise being indistinguishable from any arbitarily selected set of data bits, the decoder comprising:
   means for forming a plurality of individually identifiable clock signals, each such clock signal having reoccurring clock pulses therein, the clock pulses of each such clock signal differing from those of each other clock signal as to time of occurrence;
   a plurality of decoders each having an input for responding to the data signal and each having an input for responding to a respective one of the plurality of clock signals;
   each decoder including:
   (a) means for sampling the data signal upon occurrence of the clock pulses in the respective clock signal to derive a sequence of sample bits;
   (b) first-in, first-out (FIFO) register means through which the sequence of sample bits propagate such that upon the occurrence of each clock pulse in the respective clock signal the FIFO register means has stored in it a successive one of a sequence of candidate cells, each such candidate cell including a block-length portion and a code-word-length portion;
   (c) testing means synchronized with the FIFO register means for successively testing each of the candidate cells to determine, as each candidate cell undergoes testing, whether its code-word-length portion bears the predetermined mapping relationship to its block-length portion as is characteristic of a valid cell; and
   (d) means for generating a candidate-valid signal for each candidate cell that upon testing is determined to be a valid cell.

7. Apparatus as defined in claim 6, wherein the clock pulses of at least one of the clock signals occur at a different pulse repetition frequency from the clock pulses of at least one other clock signal.

8. Apparatus as defined in claim 6, wherein the clock pulses of at least two clock signals occur at the same pulse repetition frequency but are shifted in phase relative to each other.

9. Apparatus as defined in claim 6, and further comprising cell-duration timing means for generating an error-flag signal after a predetermined interval of time elapses during which no candidate-valid signal is generated.

10. A record/playback system for storing on a storage medium and subsequently deriving the stored information from the storage medium, the system comprising:
   encoding means operative during a recording mode of operation, the encoding means including means for receiving an input signal, means responsive to the input signal for generating a write signal coded to define cells, each cell including a plurality of data bits constituting a data block and a plurality of redundancy bits constituting a data-dependent code word bearing a predetermined mapping relationship to the data block of the cell and otherwise being indistinguishable from any arbitrarily selected set of data bits, and means for writing the write signal onto the storage means, and
   decoding means operative during a playback mode of operation, the decoding means including
   (a) reading means for deriving a readout signal from the storage medium; the readout signal representing, at spaced points in time, information including the pre-recorded data bits and redundancy bits the readout signal being characterized by a tolerance with respect to the points in time at which it defines the information;
   (b) means for forming a plurality of individually identifiable clock signals, each such clock signal having reoccurring clock pulses therein, the clock pulses of each such clock signal differing from those of each other clock signal as to time of occurrence;
   (c) a plurality of decoders each having an input for responding to the readout signal and each having an input for responding to a respective one of the plurality of clock signals;
   each decoder including:
   (i) means for sampling the readout signal upon occurrence of the clock pulses in the respective clock signal to derive a sequence of sample bits;
   (ii) first-in, first-out (FIFO) register means through which the sequence of sample bits propagate such that upon the occurrence of each clock pulse in the respective clock signal the FIFO register means has stored in it a successive one of a sequence of candidate cells, each such candidate cell including a block-length portion and a code-word-length portion;
   (iii) testing means synchronized with the FIFO register means for successively testing each of the candidate cells to determine, as each candidate cell undergoes testing, whether its code-word-length portion bears the predetermined mapping relationship to its block-length portion as is characteristic of a valid cell; and
   (iv) means for generating a candidate-valid signal for each candidate cell that upon testing is determined to be a valid cell.

11. A process for detecting data-dependent boundary-marking code words in a serial-by-byte, parallel-by-bit signal defining a plurality of multi-bit cells, each cell including m data bits constituting a block and n redundancy bits constituting a boundary-marking code word bearing a predetermined mapping relationship to the block of the cell and otherwise being indistinguishable from any arbitrarily selected set of n data bits, the process comprising the steps of:
   repetitiously sampling the serial-by-byte, parallel-by-bit signal to derive a plurality of parallel sample bits;
   congregating a multiplicity of partially overlapping groups of the sample bits as candidate cells, each candidate cell including an m-bit portion and an n-bit portion, the overlapping of groups being such that the n-bit portion of each candidate cell is separately included among the m-bit portion of a plurality of other candidate cells;
   testing each of the multiplicity of candidate cells to determine, as each candidate cell undergoes testing, whether its n-bit portion bears the predetermined mapping relationship to its m-bit portion as is characteristic of a valid cell; and
   generating a candidate-valid signal for each candidate cell that upon testing is determined to be a valid cell.

12. A process as defined in claim 11, wherein m is an integral multiple of n, and wherein the sampling step samples n bits at a time.

* * * * *

UNITED STATES PATENT AND TRADEMARK OFFICE
CERTIFICATE OF CORRECTION

PATENT NO. : 4,404,676
DATED : September 13, 1983
INVENTOR(S) : Erik P. DeBenedictis It is certified that error appears in the above-identified patent and that said Letters Patent is hereby corrected as shown below:

Change the assignee from "Pioneer Electric Corporation" to -- Pioneer Electronic Corporation --. Column 2, line 67, "sybsystem" should read -- subsystem --. Column 4, line 58, "techniques" should read -- technique --. Column 5, line 12, "$x_3$" should read -- $x^3$ --; line 57, "$x_6$" should read -- $x^6$ --. Column 8, line 38, "signals" should read -- signal --. Column 11, line 35, "bit-by-dit" should read -- bit-by-bit --. Column 13, line 31, "idicate" should read -- indicate --; line 52, "buffery" should read -- buffer --. Column 14, line 66, "classes" should read --class --; lines 67, 68, "$x^1{}^0$" should read -- $x^{10}$ --.

Signed and Sealed this

Twenty-ninth Day of May 1984

[SEAL]

Attest:

GERALD J. MOSSINGHOFF

Attesting Officer

Commissioner of Patents and Trademarks